(12) United States Patent
Chen et al.

(10) Patent No.: US 12,207,425 B2
(45) Date of Patent: Jan. 21, 2025

(54) HEAD-MOUNTED DEVICE BASED ON VIRTUAL REALITY TECHNOLOGY AND METHOD FOR CONTROLLING HEAD-MOUNTED DEVICE

(71) Applicant: Luxshare Precision Technology (Nanjing) Co., LTD, Nanjing (CN)

(72) Inventors: Lixiang Chen, Nanjing (CN); Guojun Xu, Nanjing (CN); Cheng Wang, Nanjing (CN)

(73) Assignee: LUXSHARE PRECISION TECHNOLOGY (NANJING) CO., LTD, Nanjing (CN)

( * ) Notice: Subject to any disclaimer, the term of this patent is extended or adjusted under 35 U.S.C. 154(b) by 38 days.

(21) Appl. No.: 18/209,247

(22) Filed: Jun. 13, 2023

(65) Prior Publication Data
US 2024/0324121 A1    Sep. 26, 2024

(30) Foreign Application Priority Data
Mar. 20, 2023  (CN) ......................... 202310273689.4

(51) Int. Cl.
*H05K 5/02*    (2006.01)
*G02B 27/01*    (2006.01)
*G02C 5/14*    (2006.01)

(52) U.S. Cl.
CPC ......... *H05K 5/0217* (2013.01); *G02B 27/017* (2013.01); *G02C 5/14* (2013.01)

(58) Field of Classification Search
CPC ....... H05K 5/0217; G02B 27/017; G02C 5/14
See application file for complete search history.

(56) References Cited

U.S. PATENT DOCUMENTS 9,128,283 B1 *  9/2015  Heinrich .............. G02C 13/001
2016/0274379 A1 *  9/2016  Chao ...................... G02C 7/085
2022/0121033 A1 *  4/2022  Cai .................... G02B 27/0176

FOREIGN PATENT DOCUMENTS

CN    114815253 A  *  7/2022
CN    115390254 A    11/2022

* cited by examiner

*Primary Examiner* — David D Davis
(74) *Attorney, Agent, or Firm* — Birch, Stewart, Kolasch & Birch, LLP (57) ABSTRACT

Provided are a head-mounted device and a method for controlling a head-mounted device. The head-mounted device includes an adjustment assembly. The adjustment assembly includes an adjustment push block, a driving apparatus and an adjustment gear. Two adjustment push blocks are provided. One of the device host and the at least one of the device legs is provided with a fixed seat, and the other of the device host and the at least one of the device legs is provided with a movable seat, and each of the two adjustment push blocks is slidably disposed on the fixed seat. The adjustment gear is disposed at an output end of the driving apparatus, is located between the two adjustment push blocks, and is meshed with the two adjustment push blocks, and the two adjustment push blocks are configured to drive the device legs to rotate in opposite directions.

20 Claims, 6 Drawing Sheets

HEAD-MOUNTED DEVICE BASED ON VIRTUAL REALITY TECHNOLOGY AND METHOD FOR CONTROLLING HEAD-MOUNTED DEVICE

CROSS-REFERENCE TO RELATED APPLICATIONS

This application claims priority to Chinese Patent Application No. 202310273689.4 filed Mar. 20, 2023, the disclosure of which is incorporated herein by reference in its entirety.

TECHNICAL FIELD

The present disclosure relates to the technical field of intelligent head-mounted devices, and in particular to, a head-mounted device and a method for controlling a head-mounted device.

BACKGROUND

In existing intelligent head-mounted devices such as intelligent glasses, AR devices and VR devices, some of the intelligent head-mounted devices are not configured with an adjustment apparatus, and a clamping force needs to be provided according to an elastic deformation amount of the material itself so as to be fixedly worn, whereby the range of applicability is small, and pressures perceived by different users upon wearing the intelligent head-mounted devices are different. Some of the intelligent head-mounted devices are fixedly worn by using an elastic strap, whereby the range of applicability is also small, and users with different head shapes have different comfortableness upon wearing the intelligent head-mounted devices. Some of the intelligent head-mounted devices are configured with the adjustment apparatus, but it is necessary to adjust the wearing tightness by using a manual knob, whereby the adjustment precision is poor, the adjusting process is complex and tedious, time and labor are wasted, and the adaptability is poor.

SUMMARY

The present disclosure provides a head-mounted device and a method for controlling a head-mounted device, which can efficiently and conveniently adjust the tightness and improve the wearing applicable range.

To achieve the objective, the present disclosure adopts the technical solutions described below. A head-mounted device is provided, the head-mounted device includes a device host and two device legs, where each of the two device legs is connected to the device host, at least one of the device legs is configured with an adjustment assembly, and the adjustment assembly includes two adjustment push blocks, a driving apparatus and an adjustment gear. The adjustment gear is disposed at an output end of the driving apparatus, is located between the adjustment push blocks, and is meshed with the adjustment push blocks. For a device leg with the adjustment assembly, one of the device host and the device leg is provided with a fixed seat, and the other of the device host and the device leg is provided with a movable seat, and each of the adjustment push blocks is slidably disposed on the fixed seat. When the driving apparatus is configured to drive the adjustment gear to rotate, one of the adjustment push blocks is configured to drive the device leg to rotate relative to a balanced position by pushing against the movable seat, and the two adjustment push blocks are configured to move in opposite directions to drive the device leg to rotate.

In an embodiment, each of the adjustment push blocks includes a push rod and a support block which are connected to each other, where the push rod is slidingly connected to the fixed seat, and the support block is meshed with the adjustment gear.

In an embodiment, the fixed seat is disposed on the device host, the device host is further provided with a guide bump, the support block is provided with a guide channel, and the guide bump is slidingly disposed in the guide channel.

The movable seat is provided with a boss, the boss is located between the adjustment push blocks, and the boss abuts against the fixed seat.

The boss is provided with a stop-abutting arc surface, and the stop-abutting arc surface 211 abuts against the fixed seat.

In an embodiment, the movable seat is further provided with two push-abutting surfaces, the two push-abutting surfaces are symmetrically disposed on two sides of the boss, and the adjustment push blocks are configured to abut against and push the two push-abutting surfaces in a one-to-one correspondence manner.

In an embodiment, the adjustment assembly further includes a reset apparatus, the device leg is connected to the device host through the reset apparatus, and the reset apparatus is configured to drive the device leg to stop in the balanced position relative to the device host.

In an embodiment, the reset apparatus includes a rotation shaft, a connecting rod and an elastic member. The rotation shaft is fixedly disposed on the movable seat. The connecting rod is slidingly disposed on the fixed seat, and one end of the connecting rod is rotatably connected to the rotation shaft. The elastic member is sandwiched between another end of the connecting rod and the fixed seat.

In an embodiment, the adjustment assembly further includes a pressure sensor disposed on the device leg, and the driving apparatus is configured to drive the adjustment gear to act according to a pressure value detected by the pressure sensor.

In an embodiment, the fixed seat is provided with a fixed threading hole, the movable seat is provided with a movable threading hole, the pressure sensor is connected to a controller in the device host through a wire, and the wire is passed through the fixed threading hole and the movable threading hole.

In an embodiment, a method for controlling a head-mounted device is provided. The method uses the head-mounted device described above and includes steps 1-4. In step 1, for a device leg with the adjustment assembly, when the head-mounted device is worn, the device leg detects and obtains a wearing pressure value through the pressure sensor. In step 2, when the wearing pressure value is greater than a set pressure value, the driving apparatus drives the adjustment gear to rotate in one direction, and then brings the adjustment push blocks to act to reduce the wearing pressure value. In step 3, when the wearing pressure value is less than the set pressure value, the driving apparatus drives the adjustment gear to rotate in another direction, and then brings the adjustment push blocks to act to increase the wearing pressure value. In step 4, when the wearing pressure value is equal to the set pressure value, the driving apparatus stops acting.

In an embodiment, the head-mounted device has multiple use modes, set pressure values corresponding to the multiple use modes are different, and the head-mounted device is configured to select a use mode of the multiple use modes of the head-mounted device on an electronic device through a signal connection with the electronic device, so that the head-mounted device operates in the selected use mode.

REFERENCE LIST 100 device host
110 fixed seat
111 fixed threading hole
200 device leg
210 movable seat
211 stop-abutting arc surface
212 push-abutting surface
213 movable threading hole
1 adjustment push block
11 push rod
12 support block
13 guide channel
2 driving apparatus
3 adjustment gear
4 reset apparatus
41 rotation shaft
42 connecting rod
43 elastic member
5 pressure sensor

DETAILED DESCRIPTION

Embodiments of the present disclosure are described in detail below, examples of these embodiments are shown in the accompanying drawings, in which the same or similar reference numerals refer to the same or similar parts or parts having the same or similar function throughout. The embodiments described below with reference to the accompanying drawings are exemplary, are intended to explain the present disclosure, and are not to be understood as limiting the present disclosure.

In the description of the present disclosure, unless otherwise expressly specified and limited, the term "connected to each other", "connected", or "fixed" is to be construed in a broad sense, for example, as fixedly connected, detachably connected: mechanically connected or electrically connected: directly connected to each other, indirectly connected to each other via an intermediary, internally connected between two components, or an interaction relation between two components. For those of ordinary skill in the art, specific meanings of the above-described terms in the present disclosure may be understood based on specific situations.

In the description of the present disclosure, unless otherwise expressly specified and limited, when a first feature is described as "above" or "below" a second feature, the first feature and the second feature may be in direct contact or be in contact via another feature between the features. Moreover, when the first feature is described as "on", "above", or "over" the second feature, the first feature is right on, above, or over the second feature or the first feature is obliquely on, above, or over the second feature, or the first feature is simply at a higher level than the second feature. When the first feature is described as "under", "below", or "underneath" the second feature, the first feature is right under, below, or underneath the second feature or the first feature is obliquely under, below, or underneath the second feature, or the first feature is simply at a lower level than the second feature.

The technical solutions of the present disclosure are further described below by way of detailed description in conjunction with the accompanying drawings.

Figure 1:
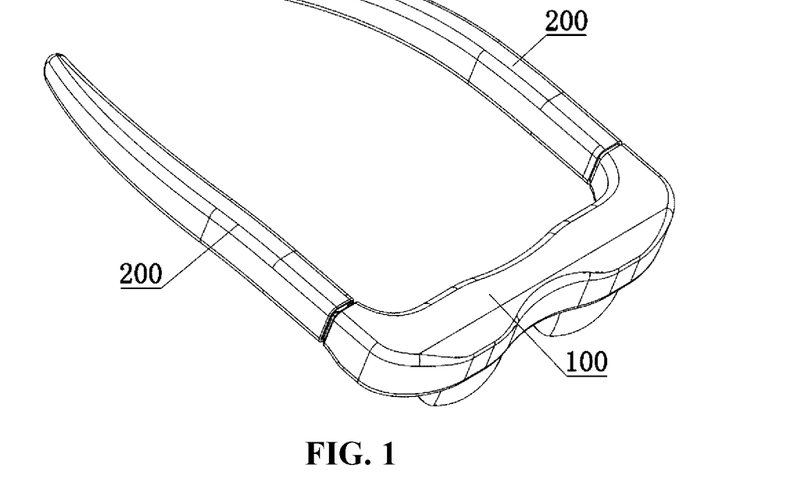
FIG. 1 is a structure view of a head-mounted device according to an embodiment of the present disclosure, with two device legs being in a balanced position.
Figure 2:
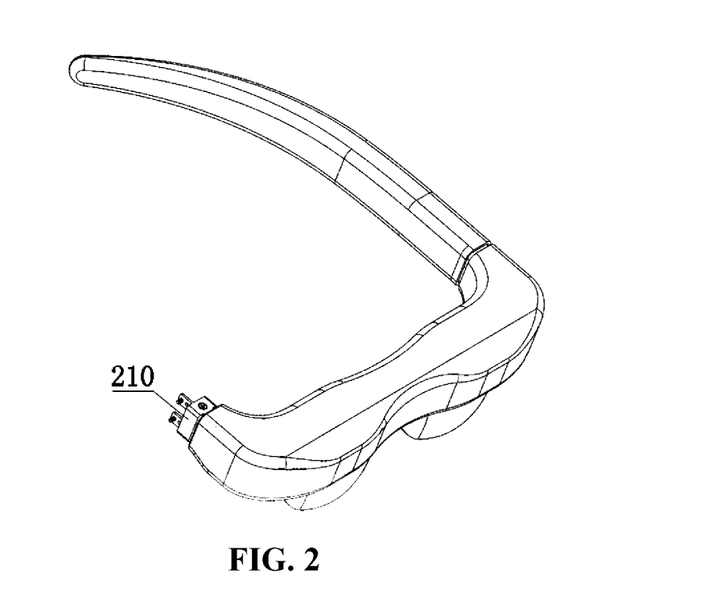
FIG. 2 is a partial structure view of a head-mounted device shown in FIG. 1.
Figure 3:
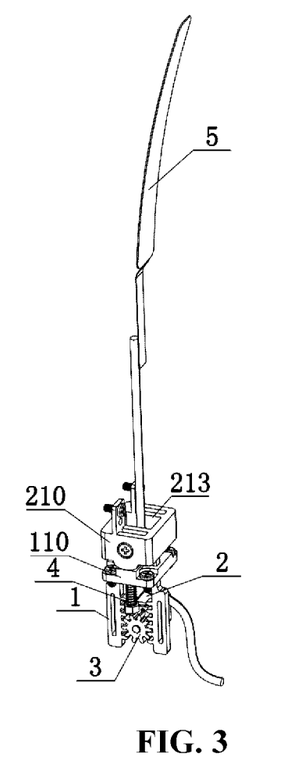
FIG. 3 is a structure view of an adjustment assembly in a head-mounted device shown in FIG. 1.
Figure 4:
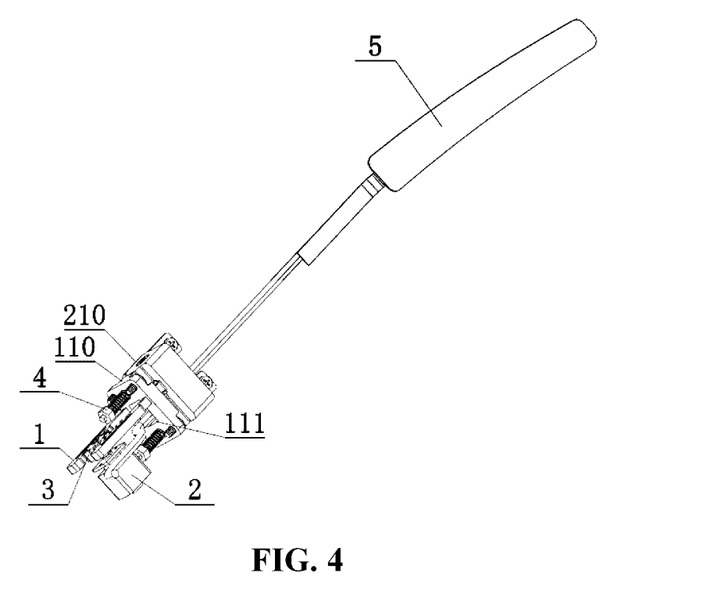
FIG. 4 is a structure view of another orientation of an adjustment assembly shown in FIG. 3.
Figure 5:
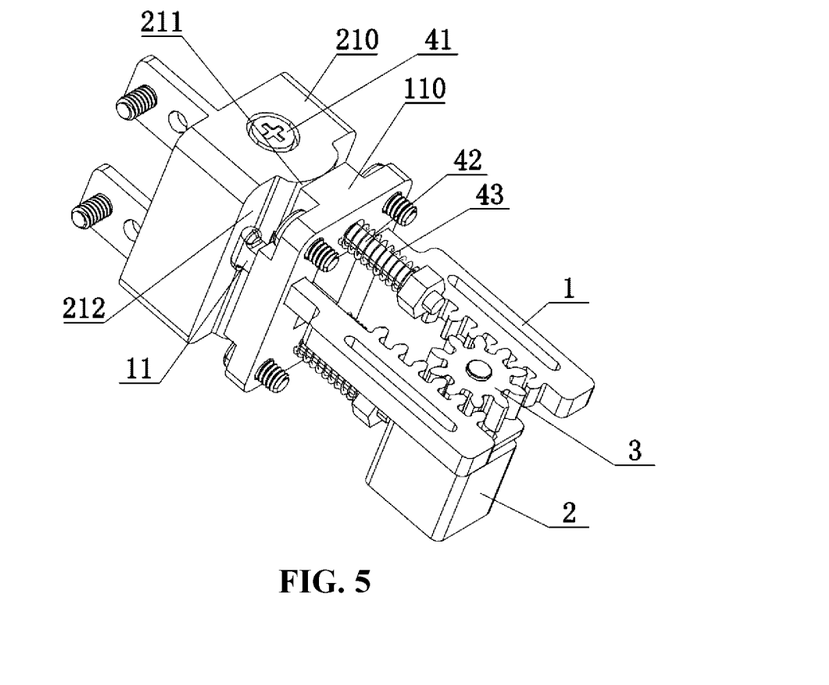
FIG. 5 is a partial structure view one of an adjustment assembly shown in FIG. 3.
Figure 6:
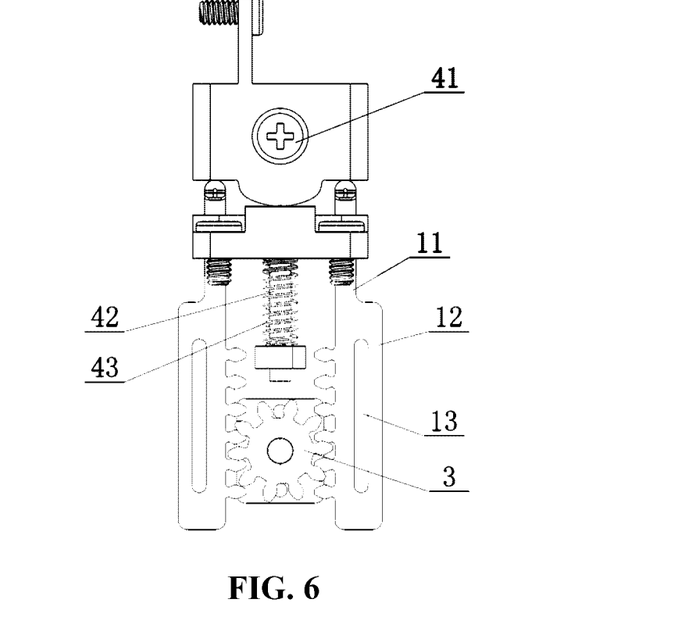
FIG. 6 is a top diagram of a structure shown in FIG. 5.
Figure 7:
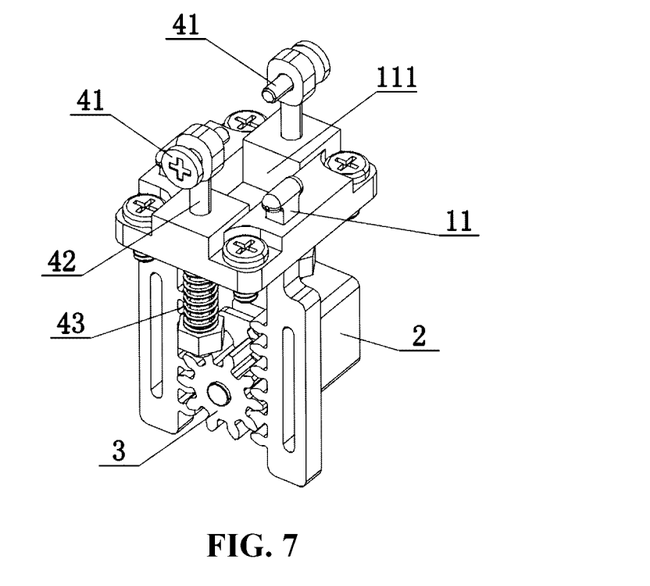
FIG. 7 is a partial structure view two of an adjustment assembly shown in FIG. 3.
Figure 8:
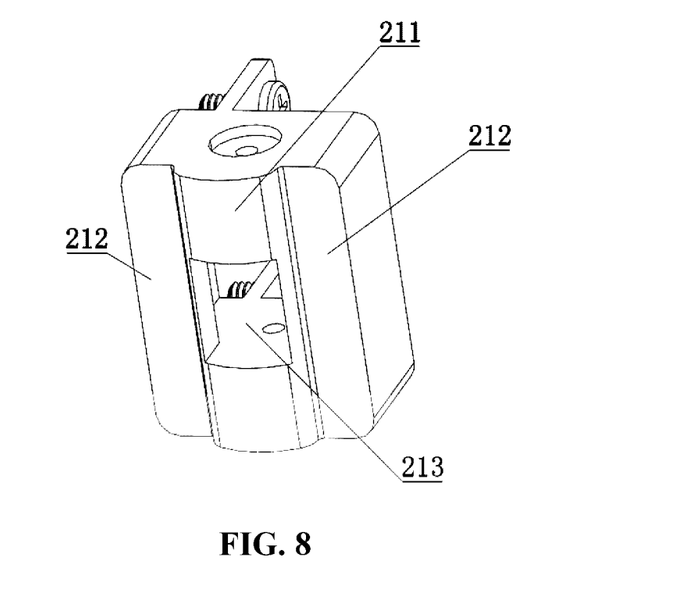
FIG. 8 is a structure view of a movable seat according to an embodiment of the present disclosure.
Figure 9:
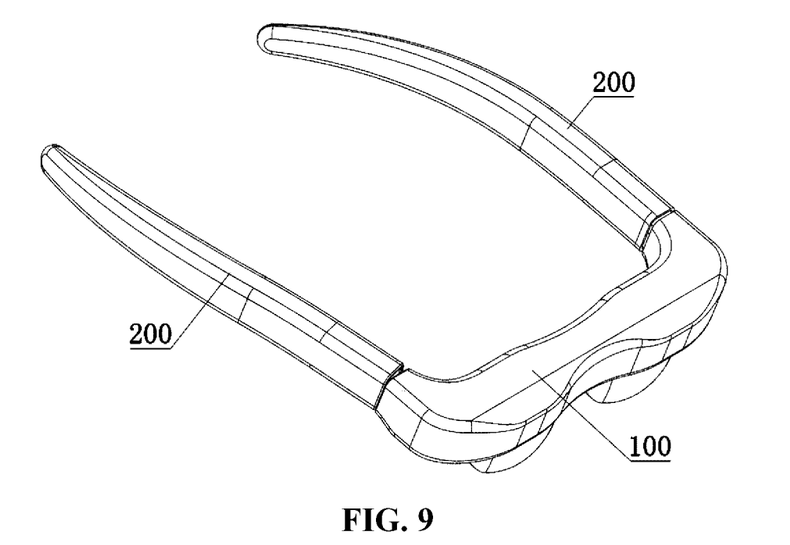
FIG. 9 is a structure view of a head-mounted device according to an embodiment of the present disclosure, with a device leg being offset from a balanced position.
Figure 10:
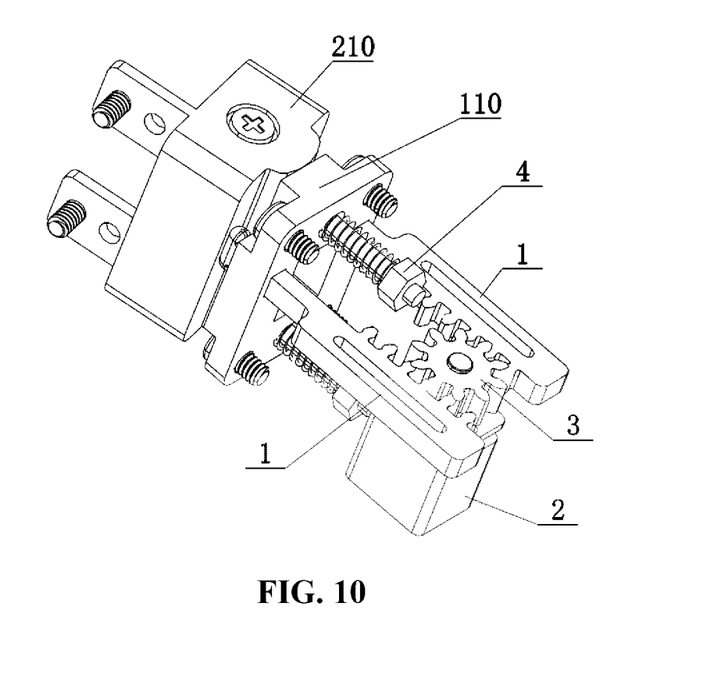
FIG. 10 is a partial structure view of a head-mounted device shown in FIG. 9.
Figure 11:
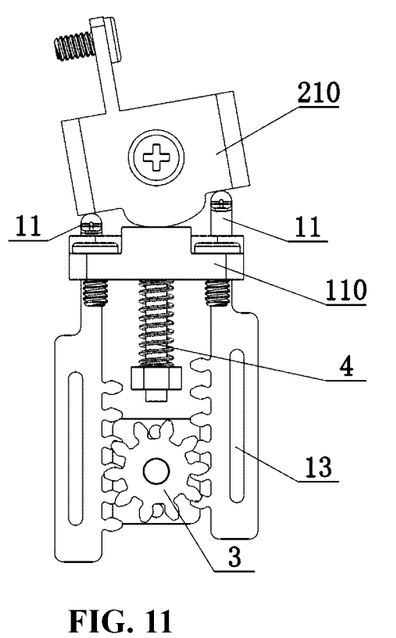
FIG. 11 is a top diagram of a structure shown in FIG. 10.

As shown in FIGS. 1 to 11, the present disclosure provides a head-mounted device. The head-mounted device includes a device host 100 and two device legs 200. Each of the two device legs 200 is connected to the device host 100, and at least one of the device legs 200 is configured with an adjustment assembly. The adjustment assembly includes an adjustment push block 1, a driving apparatus 2 and an adjustment gear 3. The adjustment gear 3 is disposed at an output end of the driving apparatus 2, is located between the adjustment push blocks 1, and is meshed with the adjustment push blocks 1. For a device leg 200 with the adjustment assembly, one of the device host 100 and the device leg 200 is provided with a fixed seat 110, and the other of the device host 100 and the device leg 200 is provided with a movable seat 210, and each of the adjustment push blocks 1 is slidably disposed on the fixed seat 110. When the driving apparatus 2 drives the adjustment gear 3 to rotate, one of the adjustment push blocks 1 is configured to drive the device leg 200 to rotate relative to a balanced position by pushing against the movable seat 210, and the two adjustment push blocks 1 are configured to move in opposite directions to drive the device leg 200 to rotate.

In the present disclosure, in a meshing state, the precision of the adjustment gear 3 being driving the adjustment push blocks 1 to extend and retract is higher, on this basis, the adjustment gear 3 is driven to rotate by the driving apparatus 2 so as to control one of the adjustment push blocks 1 on two sides of the adjustment gear 3 to be extended out, whereby the swing of the device leg 200 in two directions relative to the balanced position is achieved, thereby efficiently and conveniently adjusting the tightness of the head-mounted device upon being worn, and thus improving the wearing applicable range.

In this embodiment, the driving apparatus 2 is a servo motor and is powered by the device host 100, and the adjustment gear 3 is disposed directly on an output shaft of the motor. In addition to that, the driving apparatus 2 may also be a motor, transmission wheels and a transmission belt, and at this time, one transmission wheel is disposed on the output shaft of the motor, another transmission wheel is coaxially and fixedly connected to the adjustment gear 3, and the transmission belt is wrapped around the transmission wheels.

Specifically, the adjustment push block 1 includes a push rod 11 and a support block 12 which are connected to each other, the push rod 11 is slidingly connected to the fixed seat 110, and the support block 12 is meshed with the adjustment gear 3. The above-described structure is more focused, so that the adjustment push blocks 1 can be safely meshed with the adjustment gear 3 on the basis of smooth sliding.

More specifically; the push rod 11 is a rod-like structure and is slidably passed through in the fixed seat 10 in a first direction, one end of the push rod 11 extends out of the fixed seat 110 for pushing against the movable seat 210, another end of the push rod 11 extends out of the fixed seat 110 for being connected to the support block 12. The support block 12 is a rack structure, two support blocks 12 are disposed at intervals in a second direction, the adjustment gear 3 is located between the support blocks 12 and meshed with the support blocks 12, and the second direction is perpendicular to the first direction.

In this embodiment, each device leg 200 is configured with an adjustment assembly, the fixed seat 110 is disposed on the device host 100, the movable seat 210 is disposed on the device legs 200, and the driving apparatus 2 is correspondingly disposed on the device host 100. The device host 100 is further provided with a guide bump, a guide channel 13 is disposed on the support block 12, the guide channel 13 is configured to extend in the first direction, and the guide bump is slidingly disposed in the guide channel 13. The guide bump and the guide channel 13 are configured to cooperate to support and guide the support block 12, so that the adjustment push blocks 1 may slide more balanced and stably relative to the fixed seat 110. In addition to the above arrangement, it is also possible that the fixed seat 110 is disposed on the device leg 200 and the movable seat 210 is disposed on the device host 100, and at this time, the guide bump and the driving apparatus 2 are correspondingly disposed on the device leg 200.

Specifically, the movable seat 210 is provided with a boss, the boss is located between the adjustment push blocks 1 and abuts against the fixed seat 110. The boss is provided so that the interference between fixed seat 110 and movable seat 210 is avoided when the device legs 200 are rotated relative to the balanced position.

More specifically, the boss is provided with a stop-abutting arc surface 211, and the stop-abutting arc surface 211 abuts against the fixed seat 110. The stop-abutting arc surface 211 is provided so that the movable seat 210 is smooth smoothly when deflected.

More specifically, the movable seat 210 is further provided with two push-abutting surfaces 212, the push-abutting surfaces 212 are symmetrically disposed on two sides of the boss, and the adjustment push blocks 1 are configured to abut against and push the push-abutting surfaces 212 in one-to-one correspondence. The push-abutting surfaces 212 are provided so that the adjustment push blocks 1 is more safe and reliable in abutting against and pushing.

In this embodiment, the stop-abutting arc surface 211 is in line contact with the fixed seat 110, a line of the line contact extends in a third direction, and the push-abutting surfaces 212 are parallel to the third direction, and the third direction is perpendicular to the first direction and the second direction.

Specifically, the adjustment assembly further includes a reset apparatus 4, the device leg 200 is connected to the device host 100 through the reset apparatus 4, and the reset apparatus 4 is configured to drive the device leg 200 to stop in the balanced position relative to the device host 100. The reset apparatus 4, on the basis of the transfer function, may also allow the device leg 200 to be stably and reliably in the balanced position when the driving apparatus 2 drives the adjustment push blocks 1 to be extended and retracted to a same length relative to the fixed seat 110.

More specifically, the reset apparatus 4 includes a rotation shaft 41, a connecting rod 42 and an elastic member 43. The rotation shaft 41 is fixedly disposed on the movable seat 210. The connecting rod 42 is slidingly disposed on the fixed seat 110, and one end of the connecting rod 42 is rotationally connected to the rotation shaft 41. The elastic member 43 is sandwiched between another end of the connecting rod 42 and the fixed seat 110. The above-described structural arrangement of the reset apparatus 4 is simple and reliable. In addition to the above arrangement, the reset apparatus 4 may also be a structure in which the rotation shaft and a torsion spring cooperate, the device leg 200 is rotatably connected to the device host 100 through the rotation shaft, the torsion spring is disposed on the rotation shaft, to drive the device legs 200 to stop in the balanced position relative to the device host 100.

In this embodiment, when the device leg 200 is in the balanced position, the extension lengths of the adjustment push blocks 1 relative to the fixed seat 110 are uniform, at this time, the adjustment push blocks 1 are symmetrically disposed relative to the first plane, a first plane is parallel to the first direction and is perpendicular to the second direction, the reset apparatus 4 is located on the first plane, two reset apparatuses 4 are provided, and the reset apparatuses 4 are symmetrically disposed in the third direction. The connecting rod 42 is slidingly disposed on the fixed seat 110 in the first direction. One end of the connecting rod 42 extends out of the fixed seat 110 and is provided with a socket hole, the socket hole is rotatably sleeved on the rotation shaft 41 on the movable seat 210, and the rotation shaft extends in the third direction. Another end of the connecting rod 42 extends out of the fixed seat 110 and is provided with a limiting block, and the elastic member 43 is a spring, is sleeved on the connecting rod 42, and is sandwiched between the limiting block and the fixed seat 110.

Specifically, the adjustment assembly further includes a pressure sensor 5, the pressure sensor 5 is disposed on the device leg 200, and the driving apparatus 2 is configured to drive the adjustment gear 3 to act depending on a pressure value detected by the pressure sensor 5. The pressure sensor 5 is provided so that the action of the driving apparatus 2 is more precise and reliable.

More specifically, the fixed seat 110 is provided with a fixed threading hole 111, the movable seat 210 is provided with a movable threading hole 213, the pressure sensor 5 is connected to a controller in the device host 100 through a wire, and the wire is passed through the fixed threading hole 111 and the movable threading hole 213. The above arrangement makes the electrical connection of the pressure sensor 5 and the controller more safe and reliable.

In this embodiment, the pressure sensor 5 is a thin film pressure sensor, the pressure sensor 5 is disposed on each device leg 200, the adjustment assembly on each device leg 200 is configured to control for tightness according to the pressure sensor 5 thereon. When the head-mounted device is worn, the device host 100 is located at the front side of the user's eyes, the two device legs 200 are located on two sides of the user's head, and at this time, the two device legs 200 exert pressure on the user's head to ensure the wearing stability. The two pressure sensor 5 on the two device legs 200 specifically detect the pressure exerted by the two device legs 200 on the user's head, the pressure sensor 5 and the driving apparatus 2 are each electrically connected to the controller, the pressure sensor 5 transmits the detected pressure value to the controller, on the basis of this, the controller controls the driving apparatus 2 to act so as to adjust the tightness of the head-mounted device upon being worn. The specific structures, connection circuitry and control logic of the pressure sensor 5, the driving apparatus 2 and the controller described above are conventional arrangements in the art and will not be described in detail herein.

In the head-mounted device of the present disclosure, the angle adjustment range of the device leg 200 is −15° to 15° relative to the balanced position under the driving of the driving apparatus 2. the device leg 200 can achieve the stepless angle adjustment under the driving of the servo motor, has high adjustment precision and strong adaptability, and may be adapted to different wearing pressure requirements of the user. In addition to the above-described angle range, other angles may be set according to the wearing requirements, which is not limited herein.

The present disclosure further provides a method for controlling a head-mounted device, the method uses the head-mounted device described above and includes steps 1-4. In step 1, for a device leg with the adjustment assembly, when the head-mounted device is worn, the device leg detects and obtains a wearing pressure value through the pressure sensor 5. In step 2, when the wearing pressure value is greater than a set pressure value, the driving apparatus 2 drives the adjustment gear 3 to rotate in one direction, and then brings the adjustment push blocks 1 to act to reduce the wearing pressure value. In step 3, when the wearing pressure value is less than the set pressure value, the driving apparatus 2 drives the adjustment gear 3 to rotate in another direction, and then brings the adjustment push blocks 1 to act to increase the wearing pressure value. In step 4, when the wearing pressure value is equal to the set pressure value, the driving apparatus 2 stops acting.

In the method for controlling a head-mounted device of the present disclosure, the wearing pressure value detected in real-time is compared with the set pressure value required by the target, the driving apparatus 2 is controlled to act to further drive the adjustment gear 3 to rotate clockwise or counterclockwise, so that the wearing pressure value reaches and is maintained at the set pressure value, thereby improving the wearing comfort.

Specifically, when the wearing pressure value is equal to zero, the driving apparatus 2 drives the device leg 200 to be in the balanced position through the adjustment gear 3. Through the above-described arrangements, when the head-mounted device is not worn or is placed in a power-off state, the device leg 200 are kept at the balanced position, and thus the ineffective action of the driving apparatus 2 is avoided.

More specifically, the head-mounted device has multiple use modes, set pressure values corresponding to the multiple use modes are different, and the head-mounted device is configured to select a use mode of the multiple use modes of the head-mounted device on an electronic device through a signal connection with the electronic device, so that the head-mounted device operates in the selected use mode. Through the above-described arrangement, the user may remotely manipulate the head-mounted device, which is more convenient, and thus the operation adjustment is prevented from being influenced due to a fact that the operating button or the knob on the head-mounted equipment cannot be observed when the head-mounted device is worn.

In the present disclosure, the head-mounted device is an intelligent device such as intelligent glasses, an AR device, and a VR device. The controller is an electronic IC control module disposed in the device host 100. The electronic device is a mobile phone or a tablet computer and the like. The adjustment may be accessed through a mobile phone APP, a set pressure value is set to be stored in the controller, and the set pressure value is adjusted and set by an APP on the electronic device such as the mobile phone or by an adjustment terminal on the device host 100, so that the user may set different set pressure values such as 5N, 8N and 10N according to the his/her requirement. The set pressure value may be adjusted in a range of 0 N-50 N. A maximum set pressure value is determined according to the structure and the material of glasses legs, and finally, the user is allowed to self-determine the set pressure value according to a wearing pressure withstanding value of the user, which is more flexible and has stronger applicability.

Specifically, different use modes may be defined, each use mode is applied to one scene, each use mode corresponds to one set pressure value, and the user selects the use mode through the APP on the electronic device such as the mobile phone or by the adjustment terminal on the device host 100.

More specifically, the multiple use modes include a motion mode, a viewing mode, and a comfort mode, and a corresponding motion mode option, a corresponding viewing mode options, and a corresponding comfort mode options are disposed on the APP on the electronic device such as the mobile phone. In operational use, the user clicks the motion mode option, the viewing mode option, or the comfort mode option on the APP, the electronic device sends a signal to the head-mounted device, and the head-mounted device automatically adjusts to the corresponding use mode after the signal is received. In the motion mode, the user wears the head-mounted device for a game or an exercise, and the set pressure value is relatively large. In the viewing mode, the user only needs to keep a static state, the head-mounted device worn at this time is not dropped, and the set pressure value is moderate. In the comfort mode, the set pressure value is minimized to relieve the wearing pressure.

The initial clamping force of the head-mounted device is influenced by the material aging, and the head-mounted device is loosened after it is worn for a certain period of time, however, the head-mounted device of the present disclosure may keep consistent clamping force due to the arrangement of the adjustment assembly, so that the influence of aging and relaxation of the material is avoided.

Apparently, the above-described embodiments of the present disclosure are merely examples for clearly illustrating the present disclosure and are not intended to limit the embodiments of the present disclosure. Other variations or modifications in different forms may be made in light of the above description for those of ordinary skill in the art. This need not be, nor should it be exhaustive of all embodiments. Any modifications, equivalents or improvements made within the spirit and principle of the present disclosure should be included within the scope of protection of the claims of the present disclosure.

What is claimed is:

1. A head-mounted device, comprising a device host and two device legs, wherein each of the two device legs is connected to the device host, at least one of the device legs is configured with an adjustment assembly, and the adjustment assembly comprises: two adjustment push blocks, a driving apparatus and an adjustment gear; wherein, the adjustment gear is disposed at an output end of the driving apparatus, is located between the two adjustment push blocks, and is meshed with the two adjustment push blocks;

for a device leg with the adjustment assembly, one of the device host and the device leg is provided with a fixed seat, and the other of the device host and the device leg is provided with a movable seat, and each of the two adjustment push blocks is slidably disposed on the fixed seat; and when the driving apparatus is configured to drive the adjustment gear to rotate, one of the two adjustment push blocks is configured to drive the device leg to rotate relative to a balanced position by pushing against the movable seat, and the two adjustment push blocks are configured to move in opposite directions to drive the device leg to rotate.

2. The head-mounted device of claim 1, wherein each of the two adjustment push blocks comprises a push rod and a support block which are connected to each other, the push rod is slidingly connected to the fixed seat, and the support block is meshed with the adjustment gear.

3. The head-mounted device of claim 2, wherein the adjustment assembly further comprises a pressure sensor disposed on the device leg, and the driving apparatus is configured to drive the adjustment gear to act according to a pressure value detected by the pressure sensor.

4. The head-mounted device of claim 1, wherein the movable seat is provided with a boss which is located between the two adjustment push blocks and abuts against the fixed seat.

5. The head-mounted device of claim 4, wherein the boss is provided with a stop-abutting arc surface, and the stop-abutting arc surface abuts against the fixed seat.

6. The head-mounted device of claim 5, wherein the adjustment assembly further comprises a pressure sensor disposed on the device leg, and the driving apparatus is configured to drive the adjustment gear to act according to a pressure value detected by the pressure sensor.

7. The head-mounted device of claim 4, wherein the movable seat is further provided with two push-abutting surfaces, the two push-abutting surfaces are symmetrically disposed on two sides of the boss, and the two adjustment push blocks are configured to abut against and push the two push-abutting surfaces in a one-to-one correspondence manner.

8. The head-mounted device of claim 7, wherein the adjustment assembly further comprises a pressure sensor disposed on the device leg, and the driving apparatus is configured to drive the adjustment gear to act according to a pressure value detected by the pressure sensor.

9. The head-mounted device of claim 4, wherein the adjustment assembly further comprises a pressure sensor disposed on the device leg, and the driving apparatus is configured to drive the adjustment gear to act according to a pressure value detected by the pressure sensor.

10. The head-mounted device of claim 1, wherein the adjustment assembly further comprises a reset apparatus, the device leg is connected to the device host through the reset apparatus, and the reset apparatus is configured to drive the device leg to stop in the balanced position relative to the device host.

11. The head-mounted device of claim 10, wherein the reset apparatus comprises:

a rotation shaft, wherein the rotation shaft is fixedly disposed on the movable seat;

a connecting rod, wherein the connecting rod is slidingly disposed on the fixed seat, and one end of the connecting rod is rotatably connected to the rotation shaft; and an elastic member, wherein the elastic member is sandwiched between another end of the connecting rod and the fixed seat.

12. The head-mounted device of claim 11, wherein the adjustment assembly further comprises a pressure sensor disposed on the device leg, and the driving apparatus is configured to drive the adjustment gear to act according to a pressure value detected by the pressure sensor.

13. The head-mounted device of claim 10, wherein the adjustment assembly further comprises a pressure sensor disposed on the device leg, and the driving apparatus is configured to drive the adjustment gear to act according to a pressure value detected by the pressure sensor.

14. The head-mounted device of claim 1, wherein the adjustment assembly further comprises a pressure sensor disposed on the device leg, and the driving apparatus is configured to drive the adjustment gear to act according to a pressure value detected by the pressure sensor.

15. A method for controlling a head-mounted device, wherein the head-mounted device comprise a device host and two device legs, wherein each of the two device legs is connected to the device host, at least one of the device legs is configured with an adjustment assembly, and the adjustment assembly comprises: two adjustment push blocks, a driving apparatus and an adjustment gear; wherein, the adjustment gear is disposed at an output end of the driving apparatus, is located between the two adjustment push blocks, and is meshed with the two adjustment push blocks;

for a device leg with the adjustment assembly, one of the device host and the device leg is provided with a fixed seat, and the other of the device host and the device leg is provided with a movable seat, and each of the two adjustment push blocks is slidably disposed on the fixed seat; and when the driving apparatus is configured to drive the adjustment gear to rotate, one of the two adjustment push blocks is configured to drive the device leg to rotate relative to a balanced position by pushing against the movable seat, and the two adjustment push blocks are configured to move in opposite directions to drive the device leg to rotate, wherein the method comprises:

for a device leg with the adjustment assembly, when the head-mounted device is worn, detecting, by the device leg, a wearing pressure value through the pressure sensor;

when the wearing pressure value is greater than a set pressure value, driving, by the driving apparatus, the adjustment gear to rotate in one direction, thereby driving the two adjustment push blocks to act to reduce the wearing pressure value;

when the wearing pressure value is less than the set pressure value, driving, by the driving apparatus, the adjustment gear to rotate in another direction, thereby driving the two adjustment push blocks to act to increase the wearing pressure value; and when the wearing pressure value is equal to the set pressure value, stopping acting of the driving apparatus.

16. The method for controlling the head-mounted device of claim 15, wherein the head-mounted device has a plurality of use modes, set pressure values corresponding to the plurality of use modes are different, and the head-mounted device is configured to select a use mode of the plurality of use modes of the head-mounted device on an electronic device through a signal connection with the electronic device, so that the head-mounted device operates in the selected use mode.

17. The method for controlling the head-mounted device of claim 15, wherein each of the two adjustment push blocks comprises a push rod and a support block which are connected to each other, the push rod is slidingly connected to the fixed seat, and the support block is meshed with the adjustment gear.

18. The method for controlling the head-mounted device of claim 15, wherein the movable seat is provided with a boss which is located between the two adjustment push blocks and abuts against the fixed seat.

19. The method for controlling the head-mounted device of claim 18, wherein the boss is provided with a stop-abutting arc surface, and the stop-abutting arc surface abuts against the fixed seat.

20. The method for controlling the head-mounted device of claim 18, wherein the movable seat is further provided with two push-abutting surfaces, the two push-abutting surfaces are symmetrically disposed on two sides of the boss, and the two adjustment push blocks are configured to abut against and push the two push-abutting surfaces in a one-to-one correspondence manner.

* * * * *